United States Patent
Adachi et al.

(10) Patent No.: US 12,035,630 B2
(45) Date of Patent: Jul. 9, 2024

(54) THERMOELECTRIC CONVERSION MATERIAL, THERMOELECTRIC CONVERSION ELEMENT, THERMOELECTRIC CONVERSION MODULE, AND OPTICAL SENSOR

(71) Applicants: Sumitomo Electric Industries, Ltd., Osaka (JP); Toyota School Foundation, Nagoya (JP)

(72) Inventors: Masahiro Adachi, Osaka (JP); Yoshiyuki Yamamoto, Osaka (JP); Tsunehiro Takeuchi, Nagoya (JP)

(73) Assignees: SUMITOMO ELECTRIC INDUSTRIES, LTD., Osaka (JP); TOYOTA SCHOOL FOUNDATION, Nagoya (JP)

( * ) Notice: Subject to any disclaimer, the term of this patent is extended or adjusted under 35 U.S.C. 154(b) by 307 days.

(21) Appl. No.: 17/633,578

(22) PCT Filed: Jul. 15, 2020

(86) PCT No.: PCT/JP2020/027442
§ 371 (c)(1),
(2) Date: Feb. 8, 2022

(87) PCT Pub. No.: WO2021/039168
PCT Pub. Date: Mar. 4, 2021

(65) Prior Publication Data
US 2022/0310897 A1    Sep. 29, 2022

(30) Foreign Application Priority Data

Aug. 30, 2019 (JP) .................. 2019-158548

(51) Int. Cl.
*H10N 10/852* (2023.01)
*G01J 5/12* (2006.01)
*H10N 10/17* (2023.01)

(52) U.S. Cl.
CPC ............. *H10N 10/852* (2023.02); *G01J 5/12* (2013.01); *H10N 10/17* (2023.02)

(58) Field of Classification Search
None
See application file for complete search history.

(56) References Cited

U.S. PATENT DOCUMENTS 5,726,381 A * 3/1998 Horio .................. H10N 10/852
136/238
11,136,692 B2   10/2021 Shi et al.
(Continued)

FOREIGN PATENT DOCUMENTS

CN   109585638 A   4/2019
JP   63-102382 A   5/1988
(Continued)

OTHER PUBLICATIONS

Li et al., "Ductile Deformation Mechanism in Semiconductor α-Ag2S", npj Computational Materials, vol. 4, 2018, 6 pages.

*Primary Examiner* — Carolyn Fin
(74) *Attorney, Agent, or Firm* — XSENSUS LLP

(57) ABSTRACT

A thermoelectric conversion material is represented by a composition formula $Ag_{2-x}\alpha_xS$, where α is one selected from among Ni, V, and Ti. The value of x is greater than 0 and smaller than 0.6.

20 Claims, 7 Drawing Sheets

(56) References Cited

U.S. PATENT DOCUMENTS

| | | |
|---|---|---|
| 2016/0251992 A1 | 9/2016 | Kim et al. |
| 2020/0123637 A1* | 4/2020 | Wu .......................... C23C 8/58 |
| 2020/0287116 A1* | 9/2020 | Kim ..................... C01B 32/914 |
| 2020/0403135 A1* | 12/2020 | Petkie ................. H10N 10/817 |
| 2021/0197446 A1* | 7/2021 | Hensleigh ............... B29C 64/30 |

FOREIGN PATENT DOCUMENTS

| | | |
|---|---|---|
| JP | 2016-163039 A | 9/2016 |
| WO | 2014/126211 A1 | 8/2014 |
| WO | 2019/153335 A1 | 8/2019 |

* cited by examiner

THERMOELECTRIC CONVERSION MATERIAL, THERMOELECTRIC CONVERSION ELEMENT, THERMOELECTRIC CONVERSION MODULE, AND OPTICAL SENSOR

CROSS-REFERENCE TO RELATED APPLICATIONS

The present application is based on PCT/JP2020/027442 filed on Jul. 15, 2020, and claims priority to Japanese Application No. 2019-158548, filed on Aug. 30, 2019, the entire contents of each are incorporated herein by reference.

TECHNICAL FIELD

The present disclosure relates to a thermoelectric conversion material, a thermoelectric conversion element, a thermoelectric conversion module, and an optical sensor.

BACKGROUND ART

Nanowires or nanotubes made of a semiconductor $Bi_2Te_3$, $Bi_2Se_3$, or $Bi_2Se_xTe_{3-x}$ ($0<x<3$) and integrated into the form of a non-woven fabric are used for a thermoelectric conversion material portion constituting a thermoelectric conversion element (e.g., Patent Literature 1). A film obtained by applying a chalcogenide nanoparticle solution to a flexible substrate and drying it is used for a thermoelectric conversion material portion constituting a thermoelectric conversion element (e.g., Patent Literature 2). A chalcogenide-based thin film deposited on a flexible substrate is used for a thermoelectric conversion material portion constituting a thermoelectric conversion element (e.g., Patent Literature 3). Further, $\alpha\text{-}Ag_2S$ (silver sulfide) is known as a material having ductility (e.g., Non Patent Literature 1).

CITATION LIST

Patent Literature

Patent Literature 1: International Patent Publication No. WO 2014/126211
Patent Literature 2: Japanese Patent Application Laid-Open No. 2016-163039
Patent Literature 3: Japanese Patent Application Laid-Open No. S63-102382

Non Patent Literature

Non Patent Literature 1: Guodong Li et al., "Ductile deformation mechanism in semiconductor $\alpha\text{-}Ag_2S$", npj Computational Materials (2018) 44

SUMMARY OF INVENTION

A thermoelectric conversion element according to the present disclosure is represented by a composition formula $Ag_{2-x}\alpha_xS$, where $\alpha$ is one selected from among Ni, V, and Ti. The value of x is greater than 0 and smaller than 0.6.

DESCRIPTION OF EMBODIMENTS

Figure 1:
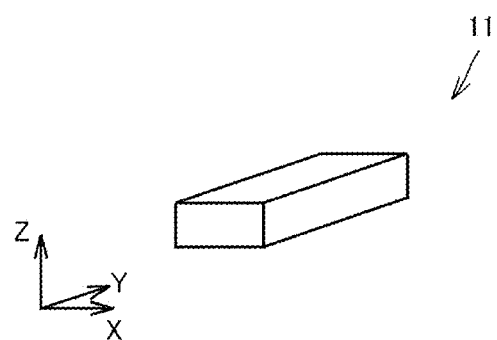
FIG. 1 is a schematic diagram showing the appearance of a thermoelectric conversion material in Embodiment 1.

Problems to be Solved by the Present Disclosure

In thermoelectric conversion, heat is directly converted into electric power, so no extra waste is discharged during the conversion. A power generation device utilizing the thermoelectric conversion requires no motor or other drive unit, offering advantages such as easy maintenance of the device.

Conceivable heat sources for thermoelectric conversion include the human body and a pipe through which a fluid higher in temperature than room temperature flows. For example, it will be preferable from the practical standpoint if a thermoelectric conversion material portion made up of a thermoelectric conversion material can be attached along a curved surface such as the surface of the human body or the surface of the pipe. A thermoelectric conversion material having flexibility will facilitate attaching the thermoelectric conversion material portion along the curved surface. A thermoelectric conversion material is also required to be capable of efficient thermoelectric conversion.

In view of the foregoing, one of the objects is to provide a thermoelectric conversion material, a thermoelectric conversion element, a thermoelectric conversion module, and an optical sensor which have flexibility and can also realize efficient thermoelectric conversion.

Advantageous Effects of the Present Disclosure

The thermoelectric conversion material described above has flexibility and is also able to realize efficient thermoelectric conversion.

Description of Embodiments of the Present Disclosure

Firstly, embodiments of the present disclosure will be listed and described. A thermoelectric conversion material according to the present disclosure is represented by a composition formula $Ag_{2-x}\alpha_xS$, where $\alpha$ is one selected from among nickel (Ni), vanadium (V), and titanium (Ti). The value of x is greater than 0 and smaller than 0.6.

The present inventors have conducted intensive studies to realize both flexibility and efficient thermoelectric conversion, and found that a thermoelectric conversion material represented by a composition formula $Ag_{2-x}\alpha_xS$, where $\alpha$ is one selected from among Ni, V, and Ti and the value of x is greater than 0 and smaller than 0.6, has flexibility and can also achieve high conversion efficiency. That is, the thermoelectric conversion material represented by the composition formula $Ag_{2-x}\alpha_x S$, where $\alpha$ is one selected from among Ni, V, and Ti and the value of x is greater than 0 and smaller than 0.6, can have flexibility and also realize efficient thermoelectric conversion.

The reason why the material exhibits such thermoelectric performance can be considered, for example, as follows. When one of Ni, V, and Ti as $\alpha$ is added, a new peak in the density of states is formed in the base material between the valence band and the conduction band, specifically at an edge of the valence or conduction band within the forbidden band. This forms an acceptor level or a donor level, thereby forming a p type or n type compound semiconductor. The value of x set to be greater than 0 and smaller than 0.6 can suppress the collapse of the density of states of the compound semiconductor. Thus, the thermoelectric conversion material of the present disclosure is considered to have flexibility and be also able to realize efficient thermoelectric conversion.

In the thermoelectric conversion material described above, the value of x may be smaller than 0.2. This can more reliably suppress the collapse of the density of states of the compound semiconductor.

In the thermoelectric conversion material described above, the value of x may be greater than 0.002. This enables the additive element to effectively impart the electrical conductivity.

In the thermoelectric conversion material described above, the value of x may be greater than 0.02. This makes it possible to more reliably obtain a thermoelectric conversion material that has flexibility and is also able to realize efficient thermoelectric conversion.

A thermoelectric conversion element of the present disclosure includes: a thermoelectric conversion material portion; a first electrode disposed in contact with the thermoelectric conversion material portion; and a second electrode disposed in contact with the thermoelectric conversion material portion and apart from the first electrode. The thermoelectric conversion material portion is constituted by the above-described thermoelectric conversion material.

In the thermoelectric conversion element of the present disclosure, the material constituting the thermoelectric conversion material portion is the above-described thermoelectric conversion material. Therefore, the thermoelectric conversion element of the present disclosure has flexibility and is also able to realize efficient thermoelectric conversion.

A thermoelectric conversion module of the present disclosure includes the above-described thermoelectric conversion element. According to the thermoelectric conversion module of the present disclosure, with the inclusion of the thermoelectric conversion element of the present disclosure having flexibility and being able to realize efficient thermoelectric conversion, a thermoelectric conversion module that has flexibility and is also able to realize efficient thermoelectric conversion can be obtained.

An optical sensor of the present disclosure includes: an absorber that absorbs optical energy; and a thermoelectric conversion material portion connected to the absorber. The thermoelectric conversion material portion is constituted by the above-described thermoelectric conversion material.

In the optical sensor of the present disclosure, the material constituting the thermoelectric conversion material portion is the above-described thermoelectric conversion material. Therefore, an optical sensor that has flexibility as well as high sensitivity can be obtained.

Details of Embodiments of the Present Disclosure

Embodiments of the thermoelectric conversion material of the present disclosure will be described below with reference to the drawings. In the drawings referenced below, the same or corresponding parts are denoted by the same reference numerals and the descriptions thereof are not repeated.

Embodiment 1

A description will be made of a configuration of a thermoelectric conversion material according to Embodiment 1 of the present disclosure. The thermoelectric conversion material according to Embodiment 1 of the present disclosure is represented by a composition formula $Ag_{2-x}\alpha_x S$, where $\alpha$ is one selected from among nickel (Ni), vanadium (V), and titanium (Ti). In the present embodiment, specifically, Ni is selected as $\alpha$. The value of x is greater than 0 and smaller than 0.6.

The thermoelectric conversion material according to Embodiment 1 can be produced, for example, through the following producing method. Firstly, silver (Ag) powder, sulfur (S) powder, and Ni powder are prepared. Here, when the thermoelectric conversion material is represented by the composition formula $Ag_{2-x}Ni_x S$, the mixing ratios of Ag and Ni are adjusted such that the value of x is greater than 0 and smaller than 0.6. The powders are mixed, pressed, and solidified into a pellet form, thereby obtaining a green compact. Next, a portion of the obtained green compact in the pellet form is heated for crystallization.

The heating of a portion of the green compact is performed within a chamber having a heater such as a resistance heating wire, for example. The chamber has a reduced pressure. Specifically, the degree of vacuum in the chamber is set to be about $1 \times 10^{-4}$ Pa, for example. The green compact is heated with the heater for about one second. When the crystallization start temperature is reached, a portion of the green compact is crystallized. The heating is stopped after the crystallization of the portion of the green compact. In this case, the crystallization is promoted by self-heating without the need of reheating. That is, the remaining portion of the green compact is crystallized by the self-heating of the green compact with the progress of crystallization. In this manner, the thermoelectric conversion material in Embodiment 1 is obtained.

FIG. 1 is a schematic diagram showing the appearance of a thermoelectric conversion material in Embodiment 1. Referring to FIG. 1, the thermoelectric conversion material 11 is, for example, a strip-shaped bulk body having a thickness. The thermoelectric conversion material 11 can be subjected to rolling using metal roller. Specifically, with the metal roller, the thermoelectric conversion material 11 can be rolled to a thickness in the Z direction in FIG. 1 in a range of, for example, 5 mm to 1 μm. Such a thermoelectric conversion material 11 has flexibility and does not shatter during rolling. By virtue of the flexibility, the thermoelectric conversion material 11 can be bent along a curved surface, for example in the Z direction.

Figure 2:
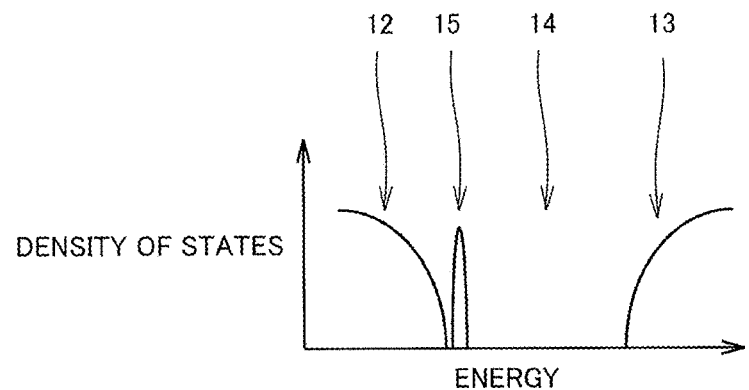
FIG. 2 is a schematic diagram showing energy states of the thermoelectric conversion material in Embodiment 1.

FIG. 2 is a schematic diagram showing energy states of the thermoelectric conversion material in Embodiment 1. In FIG. 2, the horizontal axis represents energy level and the vertical axis represents density of states.

Referring to FIG. 2, there is a forbidden band 14 between a valence band 12 and a conduction band 13. In the forbidden band 14, there exists a new level 15 formed by an additive element, Ni. Specifically, a new peak in the density of states is formed at an edge of the valence band 12 within the forbidden band 14. The new level 15 as the new peak in the density of states can increase the electrical conductivity of the thermoelectric conversion material in Embodiment 1, with its conductivity of p type. Accordingly, efficient thermoelectric conversion can be realized.

Figure 3:
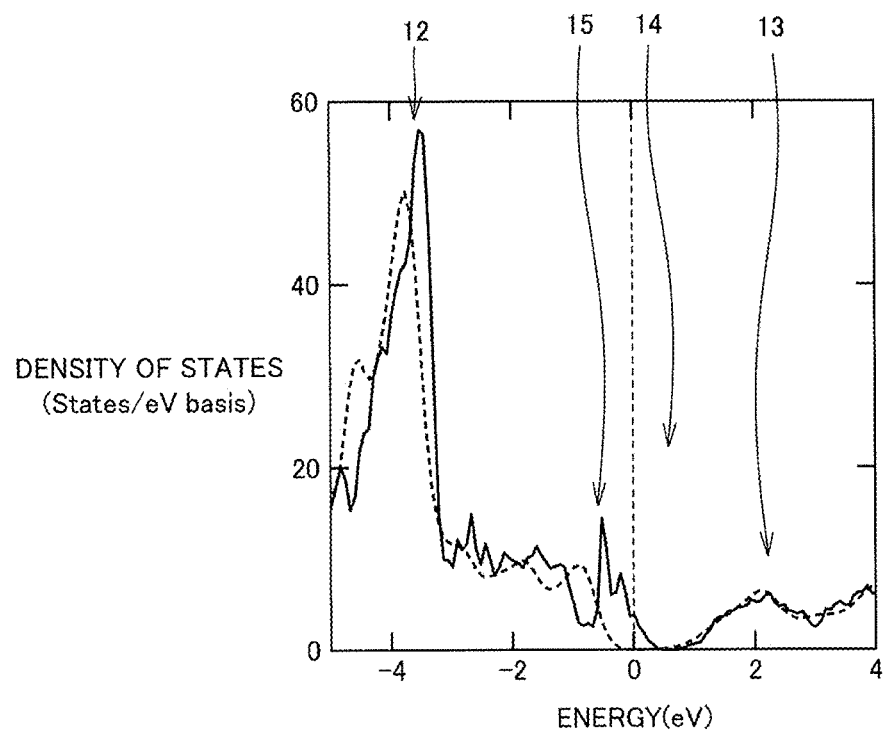
FIG. 3 shows the energy states of the thermoelectric conversion material in Embodiment 1 calculated on the basis of first-principles calculations.
Figure 5:
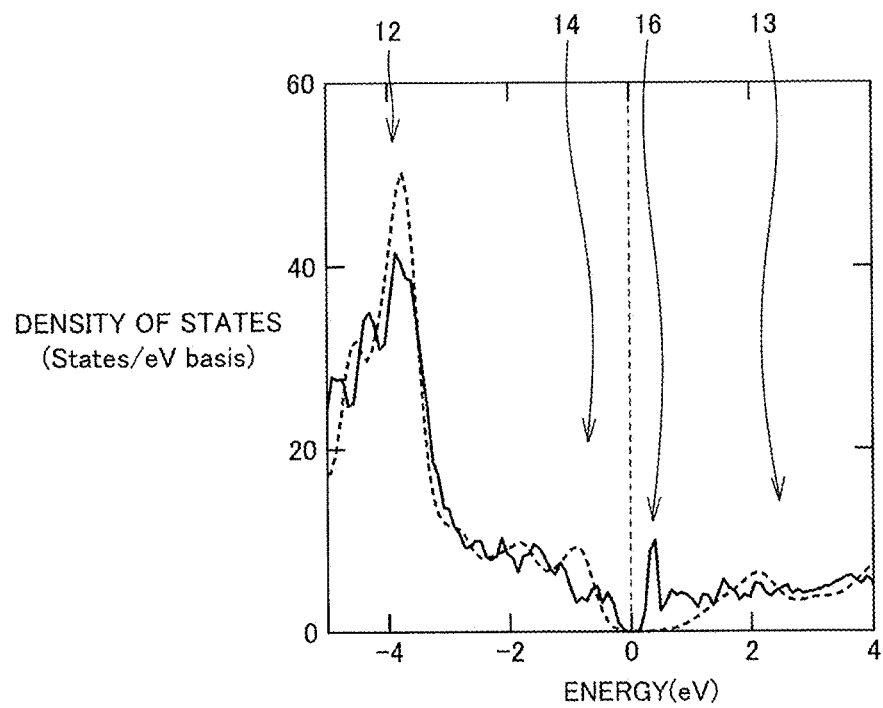
FIG. 5 shows the energy states of the thermoelectric conversion material in Embodiment 2 calculated on the basis of the first-principles calculations.
Figure 6:
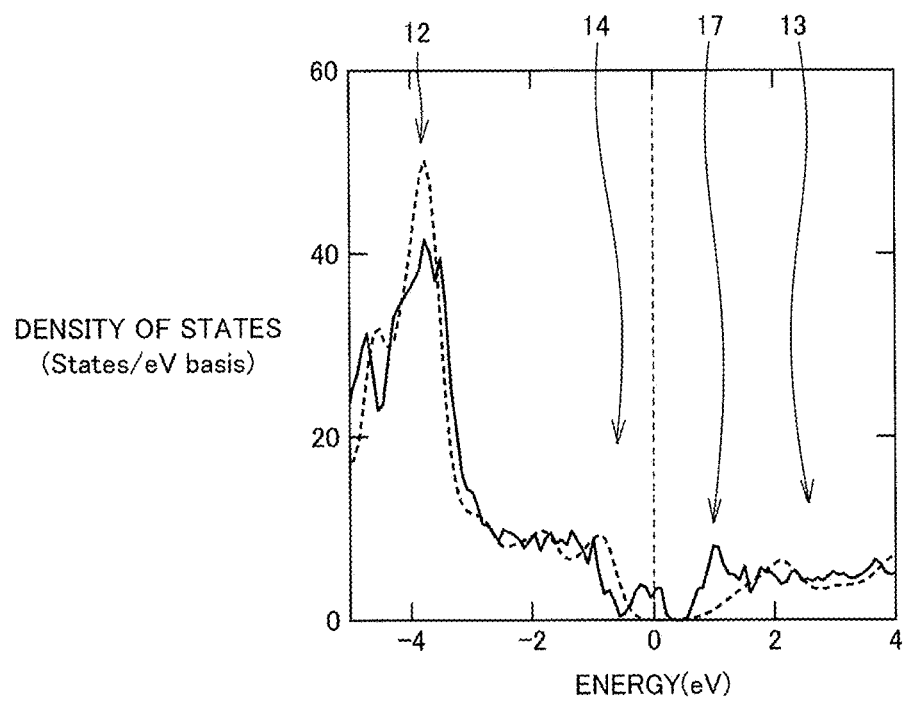
FIG. 6 shows the energy states of a thermoelectric conversion material in Embodiment 3 calculated on the basis of the first-principles calculations.

The energy states described above can also be ascertained from the results of first-principles calculations. FIG. 3 shows the energy states of the thermoelectric conversion material in Embodiment calculated on the basis of the first-principles calculations. In FIG. 3, the horizontal axis represents energy (eV) and the vertical axis represents density of states (States/eV basis). In FIG. 3, the broken line shows the energy states of $Ag_2S$ for reference. In FIGS. 5 and 6 referenced later as well, the energy states of $Ag_2S$ are shown by broken lines for reference.

Referring to FIG. 3, the energy states of the material of the composition formula $Ag_{2-x}Ni_xS$, shown by the solid line, include the valence band 12 and the conduction band 13. The new level 15 shown in FIG. 3 is formed at the edge of the valence band 12 within the forbidden band 14. As such, the existence of the new level 15 can be ascertained from the results of the first-principles calculations as well. Such a thermoelectric conversion material has flexibility and is also able to achieve high conversion efficiency.

Embodiment 2

Figure 4:
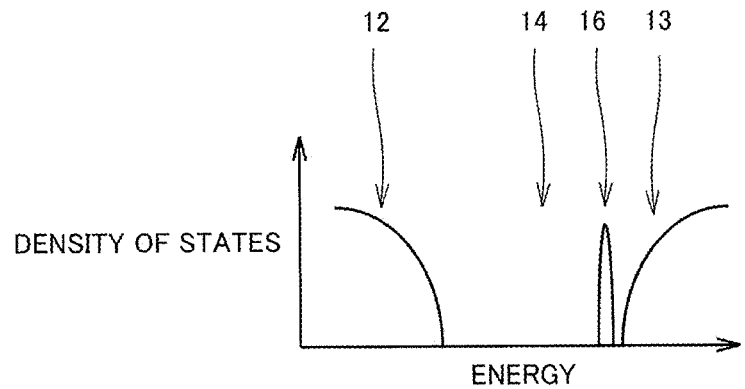
FIG. 4 is a schematic diagram showing the energy states of a thermoelectric conversion material in Embodiment 2.

Another embodiment, Embodiment 2, will now be described. A thermoelectric conversion material of Embodiment 2 differs from that of Embodiment 1 in that V is selected as α. FIG. 4 is a schematic diagram showing the energy states of the thermoelectric conversion material in Embodiment 2. In FIG. 4, the horizontal axis represents energy level and the vertical axis represents density of states.

Referring to FIG. 4, a forbidden band 14 is located between a valence band 12 and a conduction band 13. In the forbidden band 14, there exists a new level 16 formed by an additive element, V. Specifically, a new peak in the density of states is formed at an edge of the conduction band 13 within the forbidden band 14. The new level 16 as the new peak in the density of states can increase the electrical conductivity of the thermoelectric conversion material in Embodiment 2, with its conductivity of n type. Accordingly, efficient thermoelectric conversion can be realized.

In the present embodiment as well, the energy states described above can also be ascertained from the results of first-principles calculations. FIG. 5 shows the energy states of the thermoelectric conversion material in Embodiment 2 calculated on the basis of the first-principles calculations. In FIG. 5, the horizontal axis represents energy (eV) and the vertical axis represents density of states (States/eV basis).

Referring to FIG. 5, the energy states of the material of the composition formula $Ag_{2-x}V_xS$, shown by the solid line, include the valence band 12 and the conduction band 13. The new level 16 shown in FIG. 5 is formed at the edge of the conduction band 13 within the forbidden band 14. As such, the existence of the new level 16 can be ascertained from the results of the first-principles calculations as well. Such a thermoelectric conversion material has flexibility and is also able to achieve high conversion efficiency, with its conductivity of n type.

Embodiment 3

Yet another embodiment, Embodiment 3, will now be described. A thermoelectric conversion material of Embodiment 3 differs from those of Embodiment 1 and Embodiment 2 in that Ti is selected as α.

FIG. 6 shows the energy states of the thermoelectric conversion material in Embodiment 3 calculated on the basis of the first-principles calculations. In FIG. 6, the horizontal axis represents energy (eV) and the vertical axis represents density of states (States/eV basis).

Referring to FIG. 6, the energy states of the material of the composition formula $Ag_{2-x}Ti_xS$, shown by the solid line, include a valence band 12 and a conduction band 13. A new level 17 shown in FIG. 6 is formed at an edge of the conduction band 13 within the forbidden band 14. As such, the existence of the new level 17 can be ascertained from the results of the first-principles calculations as well. Such a thermoelectric conversion material has flexibility and is also able to achieve high conversion efficiency, with its conductivity of n type.

It should be noted that in the thermoelectric conversion materials in the above embodiments, the value of x may be set to be smaller than 0.2. This can more reliably suppress the collapse of the density of states of the compound semiconductor. Further, in the thermoelectric conversion materials in the above embodiments, the value of x may be set to be greater than 0.002. This enables the additive element to effectively impart the electrical conductivity. Furthermore, in the thermoelectric conversion materials in the above embodiments, the value of x may be set to be greater than 0.02. This makes it possible to more reliably obtain a thermoelectric conversion material that has flexibility and is also able to realize efficient thermoelectric conversion.

Embodiment 4

A description will now be made of a power generation element as an embodiment of a thermoelectric conversion element using the thermoelectric conversion material according to the present disclosure.

Figure 7:
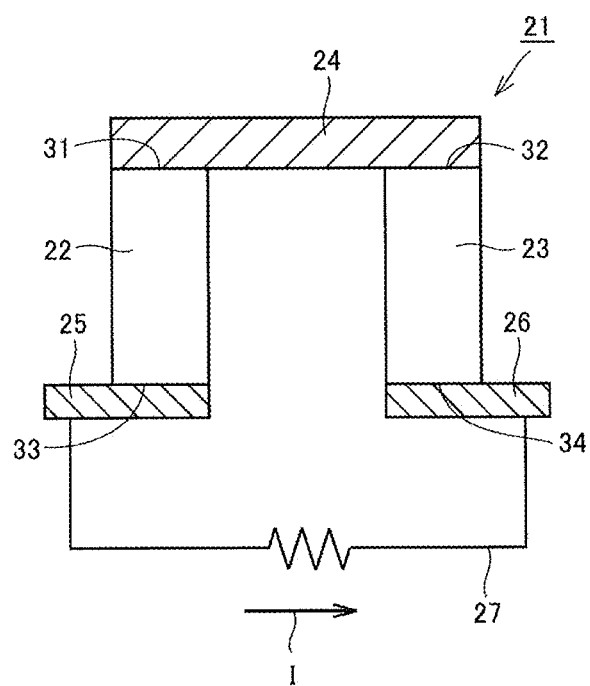
FIG. 7 is a schematic diagram showing the structure of a n type thermoelectric conversion element (power generation element), which is a thermoelectric conversion element.

FIG. 7 is a schematic diagram showing the structure of a π type thermoelectric conversion element (power generation element) 21, which is the thermoelectric conversion element in the present embodiment. Referring to FIG. 7, the π type thermoelectric conversion element 21 includes a p type thermoelectric conversion material portion 22 as a first thermoelectric conversion material portion, an n type thermoelectric conversion material portion 23 as a second thermoelectric conversion material portion, a high temperature side electrode 24, a first low temperature side electrode 25, a second low temperature side electrode 26, and a wire 27.

The n type thermoelectric conversion material portion 23 is constituted by a thermoelectric conversion material having n type conductivity. The p type thermoelectric conversion material portion 22 is constituted by the thermoelectric conversion material of Embodiment 1 having p type conductivity.

The p type thermoelectric conversion material portion 22 and the n type thermoelectric conversion material portion 23 are disposed side by side with a spacing therebetween. The high temperature side electrode 24 is disposed to extend from one end 31 of the p type thermoelectric conversion material portion 22 to one end 32 of the n type thermoelectric conversion material portion 23. The high temperature side electrode 24 is disposed so as to contact both the one end 31 of the p type thermoelectric conversion material portion 22 and the one end 32 of the n type thermoelectric conversion material portion 23. The high temperature side electrode 24 is disposed to connect the one end 31 of the p type thermoelectric conversion material portion 22 and the one end 32 of the n type thermoelectric conversion material portion 23. The high temperature side electrode 24 is composed of an electrically conductive material, such as a metal. The high temperature side electrode 24 is in ohmic contact with the p type thermoelectric conversion material portion 22 and the n type thermoelectric conversion material portion 23.

The first low temperature side electrode 25 is disposed in contact with another end 33 of the p type thermoelectric conversion material portion 22. The first low temperature side electrode 25 is disposed apart from the high temperature side electrode 24. The first low temperature side electrode 25 is composed of an electrically conductive material, such as a metal. The first low temperature side electrode 25 is in ohmic contact with the p type thermoelectric conversion material portion 22.

The second low temperature side electrode 26 is disposed in contact with another end 34 of the n type thermoelectric conversion material portion 23. The second low temperature side electrode 26 is disposed apart from the high temperature side electrode 24 and the first low temperature side electrode 25. The second low temperature side electrode 26 is composed of an electrically conductive material, such as a metal. The second low temperature side electrode 26 is in ohmic contact with the n type thermoelectric conversion material portion 23.

The wire 27 is composed of an electric conductor such as a metal. The wire 27 electrically connects the first low temperature side electrode 25 and the second low temperature side electrode 26.

In the π type thermoelectric conversion element 21, when a temperature difference is formed so that the one end 31 side of the p type thermoelectric conversion material portion 22 and the one end 32 side of the n type thermoelectric conversion material portion 23 are at a high temperature and the other end 33 side of the p type thermoelectric conversion material portion 22 and the other end 34 side of the n type thermoelectric conversion material portion 23 are at a low temperature, for example, then p type carriers (holes) move from the one end 31 side toward the other end 33 side in the p type thermoelectric conversion material portion 22. At this time, in the a type thermoelectric conversion material portion 23, n type carriers (electrons) move from the one end 32 side toward the other end 34 side. As a result, a current flows through the wire 27 in the direction of the arrow 1. In this manner, power generation by thermoelectric conversion using a temperature difference is achieved in the a type thermoelectric conversion element 21. In other words, the π type thermoelectric conversion element 21 is a power generation element.

As the material constituting the p type thermoelectric conversion material portion 22, the thermoelectric conversion material of Embodiment 1 is adopted. As a result, the π type thermoelectric conversion element 21 is a power generation element that has flexibility in the portion where the p type thermoelectric conversion material portion 22 is located. The power generation element is also able to realize efficient thermoelectric conversion.

It should be noted that a thermoelectric conversion material other than that of Embodiment 1 may be adopted as the material constituting the p type thermoelectric conversion material portion 22, and the thermoelectric conversion material of Embodiment 2 or Embodiment 3 may be adopted as the material constituting the n type thermoelectric conversion material portion 23. The resultant a type thermoelectric conversion element 21 is a power generation element that has flexibility in the portion where the n type thermoelectric conversion material portion 23 is located. The power generation element is also able to realize efficient thermoelectric conversion.

Still alternatively, the thermoelectric conversion material of Embodiment 1 may be adopted as the material constituting the p type thermoelectric conversion material portion 22 and the thermoelectric conversion material of Embodiment 2 or Embodiment 3 may be adopted as the material constituting the n type thermoelectric conversion material portion 23. The resultant π type thermoelectric conversion element 21 is a power generation element that has flexibility in the portion where the p type thermoelectric conversion material portion 22 is located and in the portion where the n type thermoelectric conversion material portion 23 is located. The power generation element is also able to realize efficient thermoelectric conversion.

In the above embodiment, the π type thermoelectric conversion element has been described as an example of the thermoelectric conversion element of the present disclosure. However, the thermoelectric conversion element of the present disclosure is not limited thereto. The thermoelectric conversion element of the present disclosure may be a thermoelectric conversion element having another structure, such as an 1 type (unileg) thermoelectric conversion element, for example.

Embodiment 5

A plurality of r type thermoelectric conversion elements 21 can be electrically connected to obtain a power generation module as a thermoelectric conversion module. A power generation module 41, the thermoelectric conversion module of the present embodiment, has a structure of a plurality of n type thermoelectric conversion elements 21 connected in series.

Figure 8:
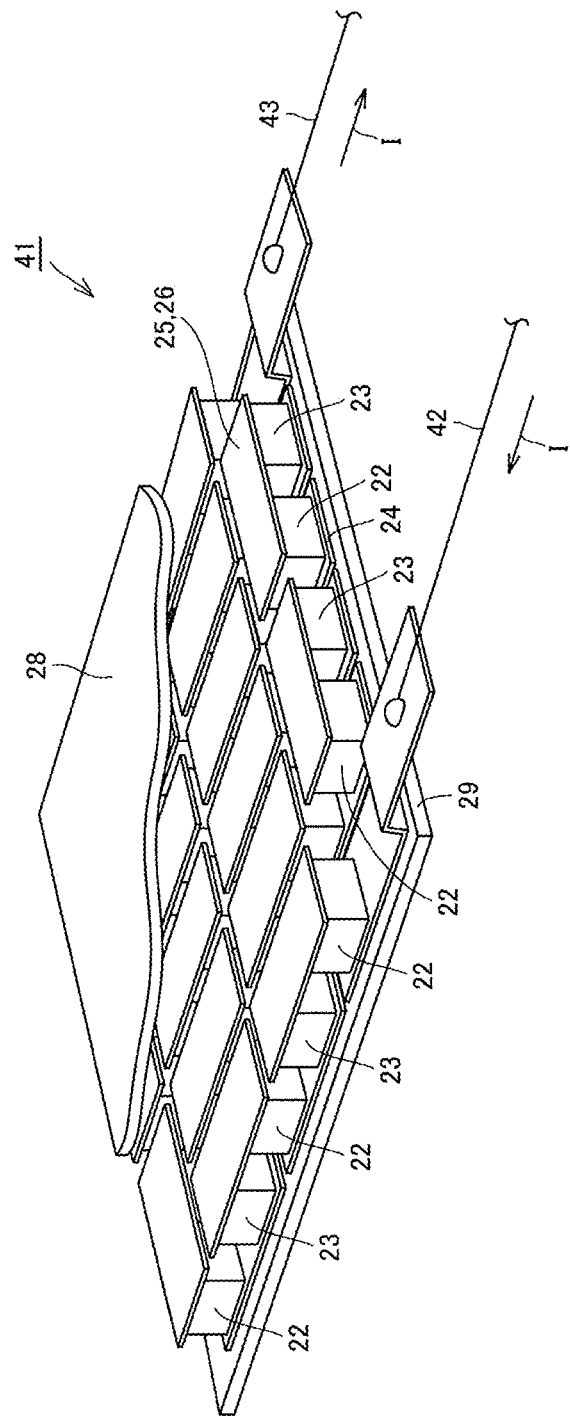
FIG. 8 shows an exemplary structure of a power generation module.

FIG. 8 shows an exemplary structure of a power generation module. Referring to FIG. 8, the power generation module 41 of the present embodiment includes p type thermoelectric conversion material portions 22, n type thermoelectric conversion material portions 23, low temperature side electrodes 25, 26 each corresponding to the first and second low temperature side electrodes 25 and 26, high temperature side electrodes 24, a low temperature side insulator substrate 28, and a high temperature side insulator substrate 29. The low temperature side insulator substrate 28 and the high temperature side insulator substrate 29 are composed of a ceramic such as alumina. The p type thermoelectric conversion material portions 22 and the n type thermoelectric conversion material portions 23 are arranged alternately side by side. A low temperature side electrode 25, 26 is disposed in contact with a p type thermoelectric conversion material portion 22 and an n type thermoelectric conversion material portion 23, as in the above-described π type thermoelectric conversion element 21. A high temperature side electrode 24 is disposed in contact with a p type thermoelectric conversion material portion 22 and an n type thermoelectric conversion material portion 23, as in the above-described a type thermoelectric conversion element 21. A p type thermoelectric conversion material portion 22 is connected to an adjacent n type thermoelectric conversion material portion 23 on one side via a common high temperature side electrode 24. This p type thermoelectric conversion material portion 22 is also connected to an adjacent n type thermoelectric conversion material portion 23 on a side different from the above one side via a common low temperature side electrode 25, 26. In this manner, all the p type thermoelectric conversion material portions 22 and n type thermoelectric conversion material portions 23 are connected in series.

The low temperature side insulator substrate 28 is disposed on a main surface side of the plate-shaped low temperature side electrodes 25, 26 opposite to the side on which they contact the p type thermoelectric conversion material portions 22 and the n type thermoelectric conversion material portions 23. One low temperature side insulator substrate 28 is disposed for the plurality of (all the) low temperature side electrodes 25, 26. The high temperature side insulator substrate 29 is disposed on a side of the plate-shaped high temperature side electrodes 24 opposite to the side on which they contact the p type thermoelectric conversion material portions 22 and the n type thermoelectric conversion material portions 23. One high temperature side insulator substrate 29 is disposed for the plurality of (all the) high temperature side electrodes 24.

Wires 27 are connected to the high temperature side electrodes 24 or the low temperature side electrodes 25, 26 in contact with the p type thermoelectric conversion material portion 22 or the n type thermoelectric conversion material portion 23 located at respective ends of the series-connected p type thermoelectric conversion material portions 22 and n type thermoelectric conversion material portions 23. When a temperature difference is formed so that the high temperature side insulator substrate 29 side attains a high temperature and the low temperature side insulator substrate 28 side attains a low temperature, then the series-connected p type thermoelectric conversion material portions 22 and n type thermoelectric conversion material portions 23 permit a current to flow in the directions of the arrows I, as in the case of the $\pi$ type thermoelectric conversion element 21 described above. In this manner, power generation by thermoelectric conversion using a temperature difference is achieved in the power generation module 41.

Embodiment 6

A description will now be made of an infrared sensor, which is one of optical sensors, as another embodiment of the thermoelectric conversion element using the thermoelectric conversion material according to the present disclosure.

Figure 9:
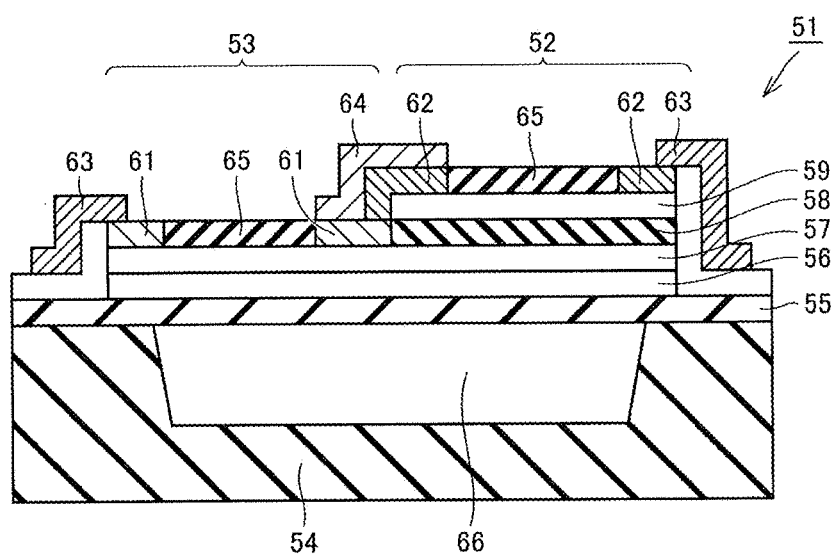
FIG. 9 shows an exemplary structure of an infrared sensor.

FIG. 9 shows an exemplary structure of an infrared sensor 51. Referring to FIG. 9, the infrared sensor 51 includes a p type thermoelectric conversion material portion 52 and an n type thermoelectric conversion material portion 53 disposed adjacent to each other. The p type thermoelectric conversion material portion 52 and the n type thermoelectric conversion material portion 53 are formed on a substrate 54.

The infrared sensor 51 includes the substrate 54, an etching stop layer 55, an n type thermoelectric conversion material layer 56, an $n^+$ type ohmic contact layer 57, an insulator layer 58, a p type thermoelectric conversion material layer 59, n side ohmic contact electrodes 61, p side ohmic contact electrodes 62, a heat absorption pad 63, an absorber 64, and a protective film 65.

The substrate 54 is composed of an insulator such as silicon dioxide. The substrate 54 has a recess 66 formed therein. The etching stop layer 55 is formed to cover a surface of the substrate 54. The etching stop layer 55 is composed of an insulator such as silicon nitride, for example. A gap is formed between the etching stop layer 55 and the recess 66 of the substrate 54.

The n type thermoelectric conversion material layer 56 is formed on a main surface of the etching stop layer 55 opposite to the substrate 54. A thermoelectric conversion material constituting the n type thermoelectric conversion material layer 56 is the thermoelectric conversion material of Embodiment 1. The $n^+$ type ohmic contact layer 57 is formed on a main surface of the n type thermoelectric conversion material layer 56 opposite to the etching stop layer 55. The $n^+$ type ohmic contact layer 57 is doped with n type impurities that cause the generation of n type carriers (electrons) as majority carriers, for example, whereby the $n^+$ type ohmic contact layer 57 has n type conductivity.

The n side ohmic contact electrode 61 is disposed to contact a central portion of a main surface of the $n^+$ type ohmic contact layer 57 opposite to the n type thermoelectric conversion material layer 56. The n side ohmic contact electrode 61 is composed of a material that can make ohmic contact with the $n^+$ type ohmic contact layer 57, such as a metal. The insulator layer 58, composed of an insulator such as silicon dioxide, for example, is disposed on the main surface of the $n^+$ type ohmic contact layer 57 opposite to the n type thermoelectric conversion material layer 56. The insulator layer 58 is disposed on the main surface of the $n^+$ type ohmic contact layer 57 on the p type thermoelectric conversion material portion 52 side with respect to the n side ohmic contact electrode 61.

The protective film 65 is also disposed on the main surface of the $n^+$ type ohmic contact layer 57 opposite to the n type thermoelectric conversion material layer 56. The protective film 65 is disposed on the main surface of the $n^+$ type ohmic contact layer 57 on the opposite side from the p type thermoelectric conversion material portion 52 side with respect to the n side ohmic contact electrode 61. On the main surface of the $n^+$ type ohmic contact layer 57 opposite to the n type thermoelectric conversion material layer 56, another n side ohmic contact electrode 61 is disposed on the opposite side from the above-described n side ohmic contact electrode 61, with the protective film 65 sandwiched therebetween.

The p type thermoelectric conversion material layer 59 is disposed on a main surface of the insulator layer 58 opposite to the $n^+$ type ohmic contact layer 57.

The protective film 65 is disposed at a central portion on a main surface of the p type thermoelectric conversion material layer 59 opposite to the insulator layer 58. On the main surface of the p type thermoelectric conversion material layer 59 opposite to the insulator layer 58, a pair of p side ohmic contact electrodes 62 are disposed sandwiching the protective film 65 therebetween. The p side ohmic contact electrodes 62 are composed of a material that can make ohmic contact with the p type thermoelectric conversion material layer 59, such as a metal. Of the pair of p side ohmic contact electrodes 62, the p side ohmic contact electrode 62 on the n type thermoelectric conversion material portion 53 side is connected to the n side ohmic contact electrode 61.

The absorber 64 is disposed to cover main surfaces of the mutually connected p side ohmic contact electrode 62 and n side ohmic contact electrode 61 opposite to the $n^+$ type ohmic contact layer 57. The absorber 64 is composed of titanium, for example. The heat absorption pad 63 is disposed to be in contact with the top surface of the p side ohmic contact electrode 62 that is not connected to the n side ohmic contact electrode 61. The heat absorption pad 63 is also disposed to be in contact with the top surface of the n side ohmic contact electrode 61 that is not connected to the p side ohmic contact electrode 62. As a material constituting the heat absorption pad 63, gold (Au)/titanium (Ti), for example, is adopted. That is, the absorber 64 and the n type thermoelectric conversion material layer 56 are thermally connected to each other. The absorber 64 and the p type thermoelectric conversion material layer 59 are thermally connected to each other.

When the infrared sensor 51 is irradiated with infrared rays, the absorber 64 absorbs the energy of the infrared rays. As a result, the temperature of the absorber 64 rises. On the other hand, the temperature rise of the heat absorption pad 63 is suppressed. This forms a temperature difference between the absorber 64 and the heat absorption pad 63. Accordingly, in the p type thermoelectric conversion material layer 59, p type carriers (holes) move from the absorber 64 side toward the heat absorption pad 63 side. On the other hand, in the n type thermoelectric conversion material layer 56, n type carriers (electrons) move from the absorber 64 side toward the heat absorption pad 63 side. Then, by extracting a current generated as a result of the migration of the carriers from the n side ohmic contact electrodes 61 and the p side ohmic contact electrodes 62, the infrared rays are detected.

In the infrared sensor 51 of the present embodiment, the thermoelectric conversion material of Embodiment 1 is adopted as the thermoelectric conversion material constituting the p type thermoelectric conversion material layer 59. As a result, the infrared sensor 51 is an infrared sensor of high sensitivity that has flexibility in the portion where the p type thermoelectric conversion material layer 59 is disposed.

Further, in the infrared sensor 51 of the present embodiment, the thermoelectric conversion material of Embodiment 2 or Embodiment 3 may be adopted as the thermoelectric conversion material constituting the n type thermoelectric conversion material layer 56. The resultant infrared sensor 51 is an infrared sensor of high sensitivity that has flexibility in the portion where the n type thermoelectric conversion material layer 56 is disposed.

The case where flexibility is required for both the portion where the p type thermoelectric conversion material layer 59 is disposed and the portion where the n type thermoelectric conversion material layer 56 is disposed can be addressed by adopting the thermoelectric conversion material of Embodiment 1 as the thermoelectric conversion material constituting the p type thermoelectric conversion material layer 59 and adopting the thermoelectric conversion material of Embodiment 2 or Embodiment 3 as the thermoelectric conversion material constituting the n type thermoelectric conversion material layer 56.

It should be understood that the embodiments disclosed herein are illustrative and non-restrictive in every respect. The scope of the present disclosure is defined by the terms of the claims, rather than the description above, and is intended to include any modifications within the scope and meaning equivalent to the terms of the claims.

DESCRIPTION OF REFERENCE NUMERALS

11 thermoelectric conversion material
12 valence band
13 conduction band
14 forbidden band
15, 16, 17 new level
21 π type thermoelectric conversion element
22, 52 p type thermoelectric conversion material portion
23, 53 n type thermoelectric conversion material portion
24 high temperature side electrode
25 first low temperature side electrode (low temperature side electrode)
26 second low temperature side electrode (low temperature side electrode)
27, 42, 43 wire
28 low temperature side insulator substrate
29 high temperature side insulator substrate
31, 32, 33, 34 end
41 thermoelectric conversion module
51 infrared sensor (optical sensor)
54 substrate
55 etching stop layer
56 n type thermoelectric conversion material layer
57 n$^+$ type ohmic contact layer
58 insulator layer
59 p type thermoelectric conversion material layer
61 n side ohmic contact electrode
62 p side ohmic contact electrode
63 heat absorption pad
64 absorber
65 protective film
66 recess
I arrow

The invention claimed is:

1. A thermoelectric conversion material represented by a composition formula $Ag_{2-x}\alpha_xS$,
    α being one selected from among Ni, V, and Ti,
    x having a value of greater than 0 and smaller than 0.6.

2. The thermoelectric conversion material according to claim 1, wherein the value of x is smaller than 0.2.

3. The thermoelectric conversion material according to claim 2, wherein the value of x is greater than 0.002.

4. The thermoelectric conversion material according to claim 3, wherein the value of x is greater than 0.02.

5. The thermoelectric conversion material according to claim 2, wherein the value of x is greater than 0.02.

6. A thermoelectric conversion element comprising:
    a thermoelectric conversion material portion, the thermoelectric conversion material portion being constituted by the thermoelectric conversion material according to claim 2;
    a first electrode disposed in contact with the thermoelectric conversion material portion; and
    a second electrode disposed in contact with the thermoelectric conversion material portion and apart from the first electrode.

7. A thermoelectric conversion module comprising the thermoelectric conversion element according to claim 6.

8. An optical sensor comprising:
    an absorber that absorbs optical energy; and
    a thermoelectric conversion material portion connected to the absorber,
    the thermoelectric conversion material portion being constituted by the thermoelectric conversion material according to claim 2.

9. The thermoelectric conversion material according to claim 1, wherein the value of x is greater than 0.002.

10. The thermoelectric conversion material according to claim 9, wherein the value of x is greater than 0.02.

11. A thermoelectric conversion element comprising:
    a thermoelectric conversion material portion, the thermoelectric conversion material portion being constituted by the thermoelectric conversion material according to claim 9;
    a first electrode disposed in contact with the thermoelectric conversion material portion; and
    a second electrode disposed in contact with the thermoelectric conversion material portion and apart from the first electrode.

12. A thermoelectric conversion module comprising the thermoelectric conversion element according to claim 11.

13. An optical sensor comprising:
  an absorber that absorbs optical energy; and
  a thermoelectric conversion material portion connected to the absorber,
  the thermoelectric conversion material portion being constituted by the thermoelectric conversion material according to claim 9.

14. The thermoelectric conversion material according to claim 1, wherein the value of x is greater than 0.02.

15. A thermoelectric conversion element comprising:
  a thermoelectric conversion material portion, the thermoelectric conversion material portion being constituted by the thermoelectric conversion material according to claim 14;
  a first electrode disposed in contact with the thermoelectric conversion material portion; and
  a second electrode disposed in contact with the thermoelectric conversion material portion and apart from the first electrode.

16. A thermoelectric conversion module comprising the thermoelectric conversion element according to claim 15.

17. An optical sensor comprising:
  an absorber that absorbs optical energy; and
  a thermoelectric conversion material portion connected to the absorber,
  the thermoelectric conversion material portion being constituted by the thermoelectric conversion material according to claim 14.

18. A thermoelectric conversion element comprising:
  a thermoelectric conversion material portion, the thermoelectric conversion material portion being constituted by the thermoelectric conversion material according to claim 1;
  a first electrode disposed in contact with the thermoelectric conversion material portion; and
  a second electrode disposed in contact with the thermoelectric conversion material portion and apart from the first electrode.

19. A thermoelectric conversion module comprising the thermoelectric conversion element according to claim 18.

20. An optical sensor comprising:
  an absorber that absorbs optical energy; and
  a thermoelectric conversion material portion connected to the absorber,
  the thermoelectric conversion material portion being constituted by the thermoelectric conversion material according to claim 1.

* * * * *